(12) United States Patent
Vimercati et al.

(10) Patent No.: US 7,567,107 B2
(45) Date of Patent: Jul. 28, 2009

(54) REDUCTION OF THE TIME FOR EXECUTING AN EXTERNALLY COMMANDED TRANSFER OF DATA IN AN INTEGRATED DEVICE

(76) Inventors: Daniele Vimercati, Via M.L. King, 10, 20048 Carate Brianza (IT); Stefan Schippers, Loc. Maraschina, 4, 37019 Peschiera del Garda (IT); Corrado Villa, Via S. Francesco, 31, 20050 Sovico (IT); Yuri Zambelli, Via Ghilardi, 7, 26019 Vailate (IT)

( * ) Notice: Subject to any disclaimer, the term of this patent is extended or adjusted under 35 U.S.C. 154(b) by 0 days.

(21) Appl. No.: 11/687,353

(22) Filed: Mar. 16, 2007

(65) Prior Publication Data
US 2007/0216449 A1  Sep. 20, 2007

(30) Foreign Application Priority Data
Mar. 16, 2006  (EP)  .................................. 06425173

(51) Int. Cl.
*G06F 1/04*  (2006.01)
(52) U.S. Cl. ...................................... 327/291; 327/295
(58) Field of Classification Search ................. 327/291, 327/295
See application file for complete search history.

(56) References Cited

U.S. PATENT DOCUMENTS

| 4,855,619 | A | 8/1989 | Hsieh et al. ................. 307/443 |
| 5,124,578 | A | 6/1992 | Worley et al. ............... 307/443 |
| 5,164,817 | A | 11/1992 | Eisenstadt et al. ........... 307/480 |
| 6,040,203 | A | 3/2000 | Bozso et al. ................. 438/106 |
| 6,252,449 | B1 * | 6/2001 | Hanriat ....................... 327/295 |
| 6,260,181 | B1 | 7/2001 | Inoue .......................... 716/10 |
| 6,333,661 | B1 | 12/2001 | Ando et al. .................. 327/313 |
| 6,879,185 | B2 * | 4/2005 | Swami et al. ................. 326/93 |
| 2003/0212971 | A1 | 11/2003 | Rodgers et al. ................ 716/6 |

* cited by examiner

*Primary Examiner*—Kenneth B. Wells
(74) *Attorney, Agent, or Firm*—Schwabe, Williamson & Wyatt, P.C.

(57) ABSTRACT

Cumulative delay contributions introduced by an input buffer and by the metal line that distributes the buffered external control signal to data transfer circuits for performing a transfer of data to and from an integrated device are reduced by having the external signal distributed unbuffered through a metal line of sufficiently large size. This introduces a negligible intrinsic propagation delay being within the specified maximum admitted input pad capacitance. The delay reduction is also based on locally dedicated input buffers for each data transfer circuit, and for applying thereto a buffered replica of the external signal present on the metal line.

15 Claims, 2 Drawing Sheets

REDUCTION OF THE TIME FOR EXECUTING AN EXTERNALLY COMMANDED TRANSFER OF DATA IN AN INTEGRATED DEVICE

FIELD OF THE INVENTION

The present invention relates in general to integrated circuits having input/output (110) buffers for communicating with devices external to the integrated circuits, and in particular, to a way of reducing the time needed for executing a transfer of data commanded from devices external to the integrated circuits.

BACKGROUND OF THE INVENTION

If one considers the signal path that determines the transfer time of data from the instant the external command is generated to the valid transition on the output pad(s) of the data in a generic integrated circuit, as schematically depicted in FIG. 1, it is evident that the electrical characteristics of the signal path in the integrated circuit of certain externally applied commands influences the time taken to complete the operation (cycle). For example, the command may be an external clock signal (CLK) applied on a dedicated input pad of the integrated circuit.

In the sample diagram of FIG. 1, focusing attention on the production of data on an external data bus, it is evident that the output buffer enabling signal OEN and the timing signal CLK are sequential to the response time of the output buffer (Tkqv=time between CLK and DQ_value Valid). External signals AVD and CEN are sequential to enabling timing of the address buffers. Therefore, any propagation delay for all these external signals or commands contributes to determination of the random access time of the integrated device.

Typically, for a memory device, the access time can be divided in three parts: INPUT time (delay between the instant at which a control/address pad assumes a valid value and the instant at which the corresponding internally propagated signal assumes a valid value on the relative internal circuit node), MAIN READ time (time taken to read the data from the array cells), and OUTPUT time (the time taken to transfer the read data to an external BUS).

FIGS. 2A and 2B illustrate certain features of typical internal propagation paths, and FIGS. 3A and 3B illustrate how the two parts, namely the OUTPUT time (or Tkqv) and the INPUT time of the access time are, in turn, sums of distinct delay contributions caused by internal circuit characteristics.

The following main contributions are graphically illustrated in the two FIGS. 3A and 3B:
T1=delay introduced by an input buffer;
T2=delay introduced by the connecting line; and
T3=delay introduced by an output buffer.

Analyzing the time Tkqv, the user generates a leading edge or front edge on the CLK_PAD when ready to accept new data from the device core that, by way of example, may be a nonvolatile flash memory.

Referring to the circuit diagram of FIG. 2B, the CLK signal needs to propagate through an input buffer. The properly dimensioned input buffer drives a metal line that distributes the buffered CLK signal to the flip-flops of all the output buffers. Finally, the data signals pass through the output buffers in order to be made available on the DQ_PADs.

In commercially available flash memory devices, the above-noted delay times are on the order of:
T1~1.5 ns;
T2~0.5 ns; and
T3~5.0 ns.

Similar considerations may be made also for the internal propagation delays of external control signals CEN and AVD of the address data input buffers. Considering the circuitry to which the delay time T1 is attributed, even the minimal circuitry needed to implement an input buffer for a control signal issued by an external user device should at least include two cascaded inverters, one of which is either a NOR gate or a three-state inverter.

FIG. 4 respectively depicts a functional circuit diagram, a detailed electrical circuit diagram and the waveforms on the pad (A) on the intermediate node (B) between the two cascaded inverters and on the driven metal line (C).

The load driven by an input buffer is represented by the metal line that distributes the external control signal to a plurality of output data buffers or to a plurality of input address data buffers, and which has a non-negligible capacitance. This is because the cumulative gate load is driven as well as because the metal line is to be sufficiently large in order not to introduce an intolerable intrinsic delay (excessively resistive) in the propagation of the CLK signal.

Therefore, as a consequence, the two cascaded inverters that constitute an input buffer cannot be of minimal size but at least the second inverter needs to be dimensioned to be able to satisfactorily drive the relatively large load as noted above. However, increasing the size of the inverters could slow down the propagation of the signal onto the capacitive metal line (heavy load). This determines a waveform as indicated by the curve C at the bottom of FIG. 4.

It is evident that there is an opportunity of minimizing or reducing the above-noted delay contributions by achieving faster input buffering.

SUMMARY OF THE INVENTION

An object of the invention is to reduce the delay time from when a valid external control signal is produced on an input pad to when a corresponding valid internal signal is propagated to a plurality of synchronizing flip-flops or buffers to be enabled.

The cumulative delay contributions (T1+T2) introduced by an input buffer and by the metal line that distributes the buffered external control signal to a plurality of synchronizing and/or enabling circuits for performing a transfer of data can be significantly reduced by having the external signal applied on a pad distributed unbuffered through a metal line of sufficiently large size (conductivity) in order to introduce a negligible intrinsic propagation delay. This may be through fulfilling the specified maximum admitted input pad capacitance, and by realizing locally dedicated input buffers to each of a plurality of synchronizing and/or enabling circuits of data transfer of the integrated device for applying thereto a buffered replica of the external signal present on the distributing metal line.

It has been verified that the delay contribution (T2) due to the signal distribution metal line can be significantly reduced, in many cases practically halved, by forming the distributing metal line with a significantly increased size. Also, the delay contribution (T1) imputed to an input buffer for producing a buffered replica of the external signal applied on the pad may be even more sensibly reduced, often to about ⅓ or even ⅙, based on each locally formed small size input buffer driving a single flip-flop (FF) or a single enabling node of a controlled inverter. Also, there is no impact from a large parasitic capacitance because of the shortness of the metal connection to the controlled node.

DETAILED DESCRIPTION OF THE PREFERRED EMBODIMENTS

The input/output architecture in accordance with the invention significantly reduces the delay contributions, thus improving both the data output speed as well as the input (access) times.

Figure 1:
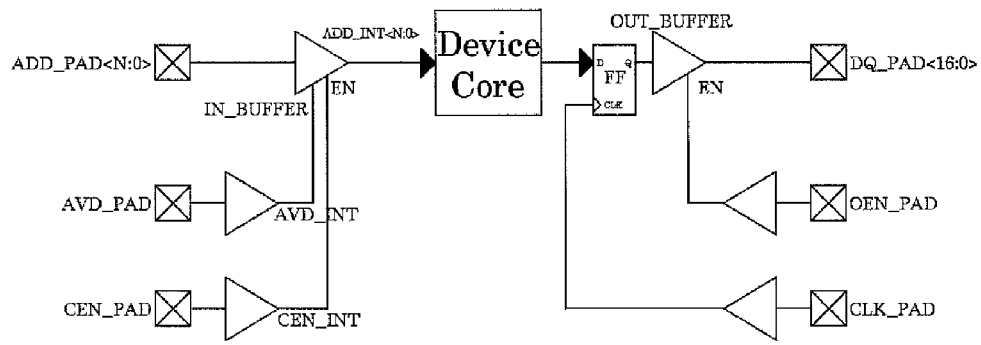
FIG. 1 depicts a generic integrated circuit with input and output data transfer structures according to the prior art.
Figure 2A:
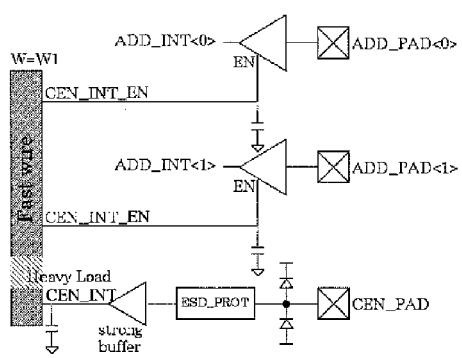
FIGS. 2A and 2B show physical details of input and output decoupling and driving structures according to the prior art.
Figure 2B:
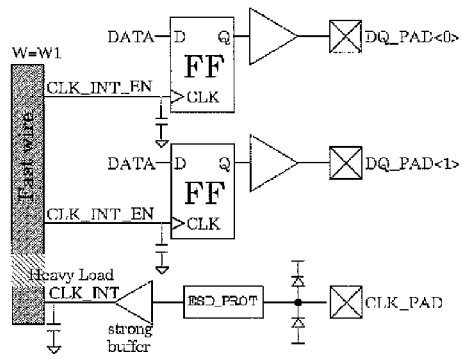
Figure 3A:
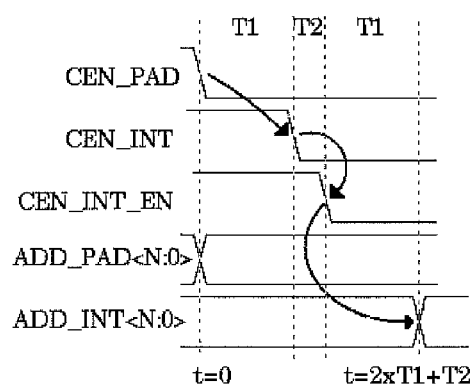
FIGS. 3A and 3B illustrate different cumulative delay contributions in inputting and outputting data according to the prior art.
Figure 3B:
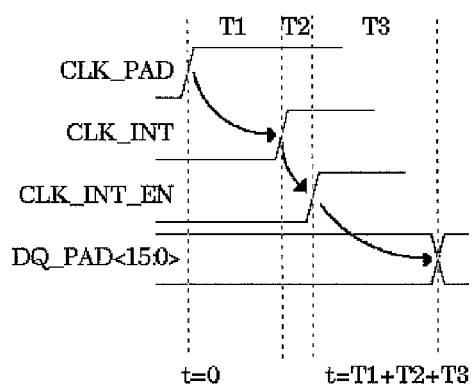
Figure 4:
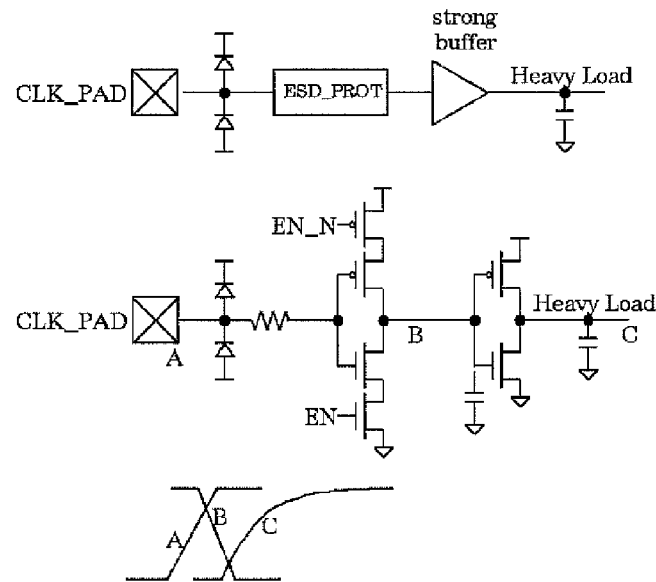
FIG. 4 illustrates a typical ISD protection and decoupling of an externally applied signal and relative effects on the speed of transitions according to the prior art.
Figures 5A, 5B:
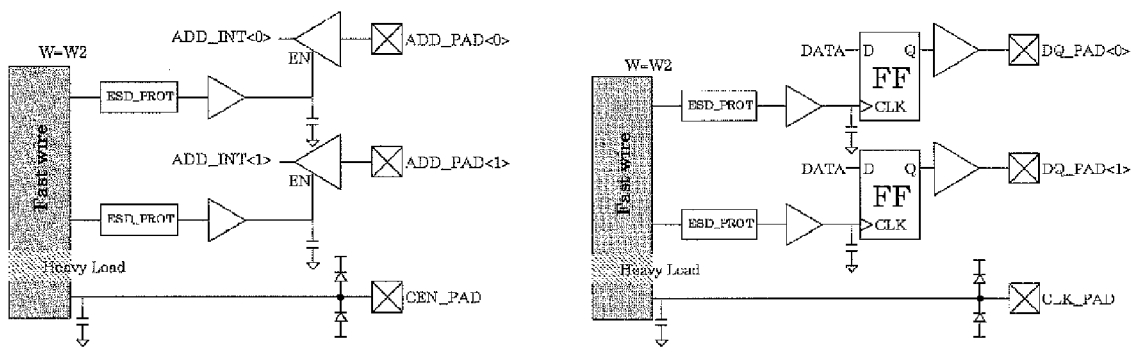
FIGS. 5A and 5B illustrate the I/O buffering architecture according of the present invention.

The architecture contemplates, as appreciated by those skilled in the art, the presence of ESD protection which, in case of parallel protection devices such as reverse biased junctions (diodes) as shown in FIGS. 5A and 5B, are commonly realized near the input pad. In case of serial type protection devices, they will be delocalized and replicated for the number of users of the input signal according to common practices, as also appreciated by those skilled in the art.

The size (width) of the low resistance distribution metal line, Fast Wire, needs to be compatible with the specifications of maximum tolerable input capacitance of the integrated device.

According to the buffering architecture, the power capabilities of the output buffers of the user device that issues the external control signal are exploited to charge the relatively heavy load constituted by the distributing metal line (Fast Wire) of the integrated circuit thus propagating the externally generated control signal very rapidly, without buffering it with an appropriately dimensioned input buffer. Differently from common practice, the necessary decoupling of the integrated circuit from the external world is implemented locally by a plurality of relatively small size (thus intrinsically fast) input buffers. Each buffer controls a respective flip-flop or enabling node of one of the two inverters constituting a local controlled buffer.

The output buffer of an external user already drives a relatively heavy load represented typically by a printed circuit board (PCB) metal line that could typically be on the order of 15-30 pF. This depends on the length of the connection line on the PCB. An additional capacitive load on the order of 0.5-1.0 pF, as constituted by an input signal distribution metal line of the integrated circuit, even if over dimensioned, hardly has any significance on the design of the output buffer of the external user.

That which is claimed:

1. A method comprising:
   receiving, by an integrated circuit, a control signal from an external device;
   distributing the control signal unbuffered through a distributing line of the integrated circuit to a first decoupling input buffer and a second decoupling input buffer;
   producing, with the first decoupling input buffer, a first buffered replica of the control signal;
   transmitting, with the first decoupling input buffer, the first buffered replica solely to a flip flop or an enabling node of an address buffer of a first data transfer circuit;
   producing, with the second decoupling input buffer, a second buffered replica of the control signal; and
   transmitting, with the second decoupling input buffer, the second buffered replica solely to a flip flop or an enabling node of an address buffer of a second data transfer circuit.

2. The method of claim 1, wherein the integrated circuit comprises an input pad having an allowed input pad capacitance and coupled to the distributing line, the distributing line having a width corresponding to the allowed input pad capacitance.

3. The method of claim 1, wherein the control signal comprises a synchronizing signal or an enabling signal.

4. The method of claim 1, wherein said transmitting the first buffered replica comprises transmitting the first buffered replica solely to the flip flop of the first data transfer circuit, said transmitting the second buffered replica comprises transmitting the second buffered replica solely to the flip flop of the second data transfer circuit, and the method further comprises:
   receiving, by the integrated circuit, another control signal from the external device,
   distributing the another control signal unbuffered through another distributing line of the integrated circuit;
   producing, with a third decoupling input buffer, a third buffered replica of the another control signal;
   transmitting, with the third decoupling input buffer, the third buffered replica solely to the enabling node of the address buffer of the first data transfer circuit;
   producing, with a fourth decoupling input buffer, a fourth buffered replica of the another control signal; and
   transmitting, with the fourth decoupling input buffer, the fourth buffered replica solely to the enabling node of the address buffer of the second data transfer circuit.

5. The method of claim 4, wherein the integrated circuit comprises a nonvolatile flash memory device, the control signal is a clock signal, and the another control signal is an enabling signal.

6. A structure comprising:
   a distributing line coupled to an input pad of an integrated device to receive an externally generated signal and to provide an unbuffered distribution of the externally generated signal; and
   a first decoupling input buffer and a second decoupling input buffer coupled to the distributing line to receive the unbuffered distribution of the externally generated signal, the first decoupling input buffer configured to produce a first buffered replica of the externally generated signal and to transmit the first buffered replica solely to a flip flop or an enabling node of an address buffer of a first data transfer circuit, and the second decoupling input buffer configured to produce a second buffered replica of the externally generated signal and to transmit the second buffered replica solely to a flip flop or an enabling node of an address buffer of a second data transfer circuit.

7. The structure of claim 6, wherein the externally generated signal comprises a synchronizing signal or an enabling signal.

8. The structure of claim 6, wherein the first decoupling input buffer is configured to transmit the first buffered replica solely to the flip flop of the first data transfer circuit, the second decoupling input buffer is configured to transmit the second buffered replica solely to the flip flop of the second data transfer circuit and the structure further comprises:

another distributing line coupled to another input pad of the integrated device to receive another externally generated signal and to provide an unbuffered distribution of the another externally generated signal; and a third decoupling input buffer and a fourth decoupling input buffer coupled to the another distributing line to receive the unbuffered distribution of the another externally generated signal, the third decoupling input buffer configured to produce a third buffered replica of the another externally generated signal and to transmit the third buffered replica solely to the enabling node of the address buffer of the first data transfer circuit, and the fourth decoupling input buffer configured to produce a fourth buffered replica of the another externally generated signal and to transmit the fourth buffered replica solely to the enabling node of the address buffer of the second data transfer circuit.

9. The structure of claim 6, wherein the integrated device comprises a nonvolatile flash memory device, the externally generated signal is a clock signal, and the another externally generated signal is an enabling signal.

10. The structure of claim 6, wherein the input pad is associated with an allowed input pad capacitance, and said distributing line has a width corresponding to the allowed input pad capacitance.

11. An integrated device comprising:

an input pad to receive an externally generated signal;

a distributing line coupled to the input pad to provide an unbuffered distribution of the externally generated signal;

a first data transfer circuit having a flip flop and an address buffer;

a second data transfer circuit having a flip flop and an address buffer;

a first decoupling input buffer coupled to the distributing line and the first data transfer circuit and configured to receive the unbuffered distribution of the externally generated signal from the distributing line, to produce a first buffered replica of the externally generated signal, and to transmit the first buffered replica solely to the flip flop or an enabling node of the address buffer of the first data transfer circuit; and a second decoupling input buffer coupled to the distributing line and the second data transfer circuit and configured to receive the unbuffered distribution of the externally generated signal from the distributing line, to produce a second buffered replica of the externally generated signal, and to transmit the second buffered replica solely to the flip flop or an enabling node of the address buffer of the second data transfer circuit.

12. The integrated device of claim 11, wherein the externally generated signal comprises a synchronizing signal or an enabling signal.

13. The integrated device of claim 11, wherein the first decoupling input buffer is configured to transmit the first buffered replica solely to the flip flop of the first data transfer circuit, the second decoupling input buffer is configured to transmit the second buffered replica solely to the flip flop of the second data transfer circuit and the integrated device further comprises:

another input pad;

another distributing line coupled to the another input pad to receive another externally generated signal and to provide an unbuffered distribution of the another externally generated signal;

a third decoupling input buffer coupled to the another distributing line and the first data transfer circuit and configured to receive the unbuffered distribution of the another externally generated signal from the another distributing line, to produce a third buffered replica of the another externally generated signal, and to transmit the third buffered replica solely to the enabling node of the address buffer of the first data transfer circuit; and a fourth decoupling input buffer coupled to the another distributing line and the second data transfer circuit and configured to receive the unbuffered distribution of the another externally generated signal from the another distributing line, to produce a fourth buffered replica of the another externally generated signal, and to transmit the fourth buffered replica solely to the enabling node of the address buffer of the second data transfer circuit.

14. The integrated device of claim 13, wherein the externally generated signal is a clock signal and the another externally generated signal is an enabling signal.

15. The integrated device of claim 11, wherein the input pad is associated with an allowed input pad capacitance, and said distributing line has a width corresponding to the allowed input pad capacitance.

\* \* \* \* \*